United States Patent [19]
Bettinger

[11] Patent Number: 5,315,255
[45] Date of Patent: May 24, 1994

[54] NON-CONTACT, ELECTROSTATIC, DISCHARGE DETECTOR

[75] Inventor: Michael J. Bettinger, Boise, Id.

[73] Assignee: Micron Technology, Inc., Boise, Id.

[21] Appl. No.: 914,784

[22] Filed: Jul. 16, 1992

[51] Int. Cl.[5] .................. G01R 29/12; G01R 31/12
[52] U.S. Cl. ................................. 324/457; 324/72; 324/536
[58] Field of Search .......... 324/72, 457, 458, 536, 324/109, 122, 123 R, 327

[56] References Cited

U.S. PATENT DOCUMENTS

| | | | |
|---|---|---|---|
| 3,404,341 | 10/1968 | Young | 324/72 |
| 3,667,036 | 5/1972 | Seachman | 324/72 |
| 3,753,102 | 8/1973 | Beck | 324/109 |
| 3,772,592 | 11/1973 | Rhodes | 324/458 |
| 3,828,256 | 8/1974 | Liu | 324/72 |
| 3,868,074 | 2/1975 | Hill | 324/72 X |
| 4,044,258 | 8/1977 | Frungel | 324/72 X |
| 4,110,685 | 8/1978 | Leenerts | 324/123 R |
| 4,349,783 | 9/1982 | Robson et al. | 324/457 |
| 4,386,315 | 5/1983 | Young et al. | 324/122 |
| 4,439,734 | 3/1984 | Weber | 324/327 |
| 4,804,922 | 2/1989 | Sometani et al. | 324/457 |
| 4,853,639 | 8/1989 | Vosteen et al. | 324/457 |
| 5,166,624 | 11/1992 | Abernathy | 324/452 |
| 5,256,974 | 10/1993 | Padden | 324/458 |

OTHER PUBLICATIONS

"Static Alert Test Board", Zero Static Systems, 12842 Inglewood Avenue, Hawthorne, Calif. 90250 (advertisement), Jan., 1991, 2 pages.

Primary Examiner—Kenneth A. Wieder
Assistant Examiner—Glenn W. Brown
Attorney, Agent, or Firm—Hopkins, French, Crockett, Springer & Hoopes

[57] ABSTRACT

A small, portable, non-intrusive device that detects the occurrence of an electrostatic discharge (ESD) during the handling, transporting, and testing of static sensitive electronic parts. It can be used to locate grounding problems in assembly equipment and is useful during repairs and assembly of electronic equipment. A preferred use is in the manufacture of semiconductor devices and the equipment containing these devices which are sensitive to ESD occurrences.

9 Claims, 2 Drawing Sheets

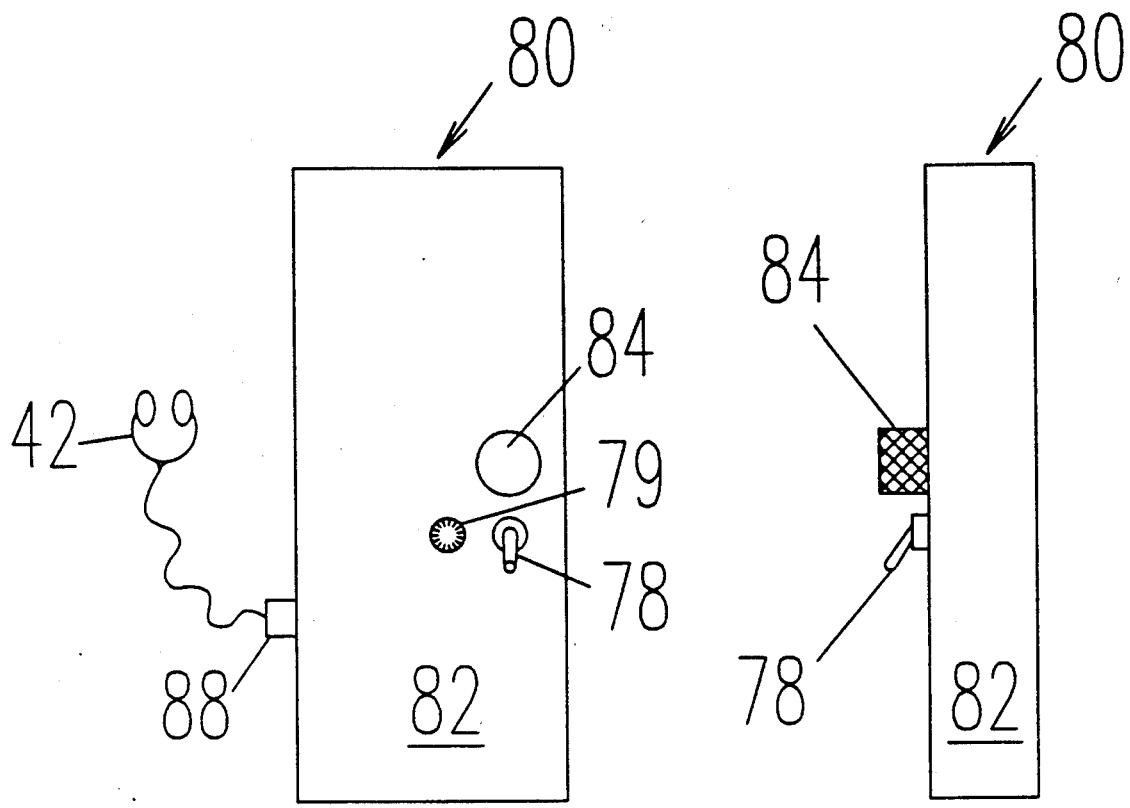
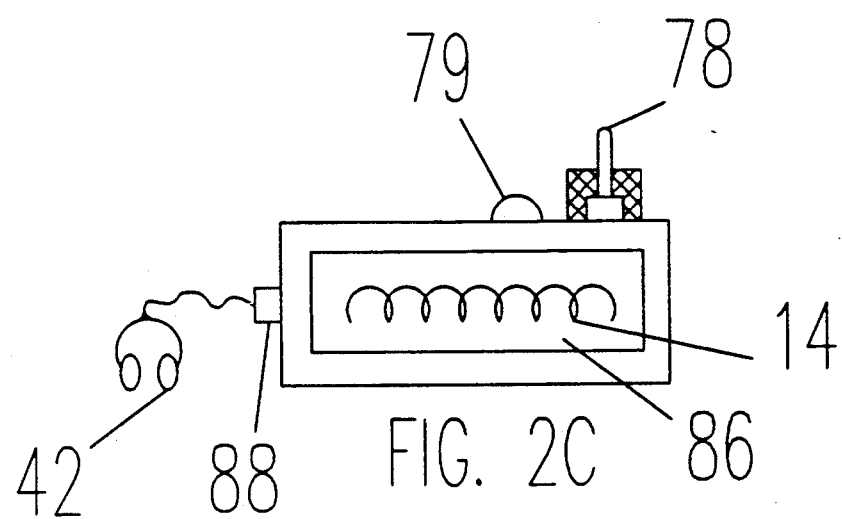

NON-CONTACT, ELECTROSTATIC, DISCHARGE DETECTOR

FIELD OF THE INVENTION

In general, the invention relates to a means for detecting an electrostatic discharge (ESD) event and, in particular, to an electrostatic discharge event detector having an impedance matched antenna, a high-impedance input circuit, and an amplification circuit to provide for suppression of impedable repeated broadcast signals and amplification of irregular, one-time events, such as electrostatic discharge.

BACKGROUND OF THE INVENTION

It is well known today that electrostatic discharge damage to electronic components and assemblies is a significant cause of semiconductor degradation and failure. Electrostatic discharge damage involves two conductors or semiconductors of different charge levels coming into close proximity of each other and the one of higher potential discharging to the one of lower potential to bring about equalization of charge. There exists in the market today a contact ESD event detector built by Zero Static Systems, Inc., which must be clipped on a particular device to be monitored and, after an ESD event, changes color and must be manually reset to be used again. It is also known to use an AM radio to detect static discharges. However, the radio's insensitivity to single event signals and, indeed, noise suppression circuits, cause it to be useful only for detection of higher levels of ESD. Accordingly, it would be desirable to have a non-contact static discharge event detector that has an impedance matched input antenna circuit that would pass through and amplify single-event received signals and suppress carrier-based RF signals and radiation from microprocessor-based electronic circuitry.

SUMMARY OF THE INVENTION

The ESD detector generally consists of an antenna, a high-impedance input circuit that passes single-event electrostatic discharges, an amplification means to amplify the single event, and an output means to audit and record the electrostatic discharge. Physically, the detector is a hand-held plastic box, similar to a remote control. It has a power switch, a gain control, and a jack to plug in a set of headphones. The basic unit can include a calibrated instrument output; impedance matching of the pickup coil allows accurate indication of discharge waveform.

It is used by listening through the headphones for very clear static sounds that occur as body charges up through movement and then discharges through touching metal or conductive objects.

It also can be used in a manner similar to a geiger counter to isolate static discharges caused by improper or defective grounding between moving machine parts used in a manufacturing process.

The use of the device during the handling or assembly of sensitive parts, i.e., semiconductors, gives instant feedback to the operator of possible damage to the parts. It also has value as a teaching aid for proper ESD handling.

Used in conjunction with a data acquisition system, it can be used to audit process or handling steps for infrequent or intermittent ESD events.

The detector is also sensitive to low-frequency interference and can be useful in the placement of electronic equipment that is sensitive to these fields, e.g., a strain gage amplifier.

Other objects, advantages, and capabilities of the present invention will become more apparent as the description proceeds.

BRIEF DESCRIPTION OF THE DRAWINGS

FIGS. 2A, 2B, and 2C are plan, side, and end views of an assembled ESD detector housing.

DETAILED DESCRIPTION OF THE INVENTION

Figure 1:
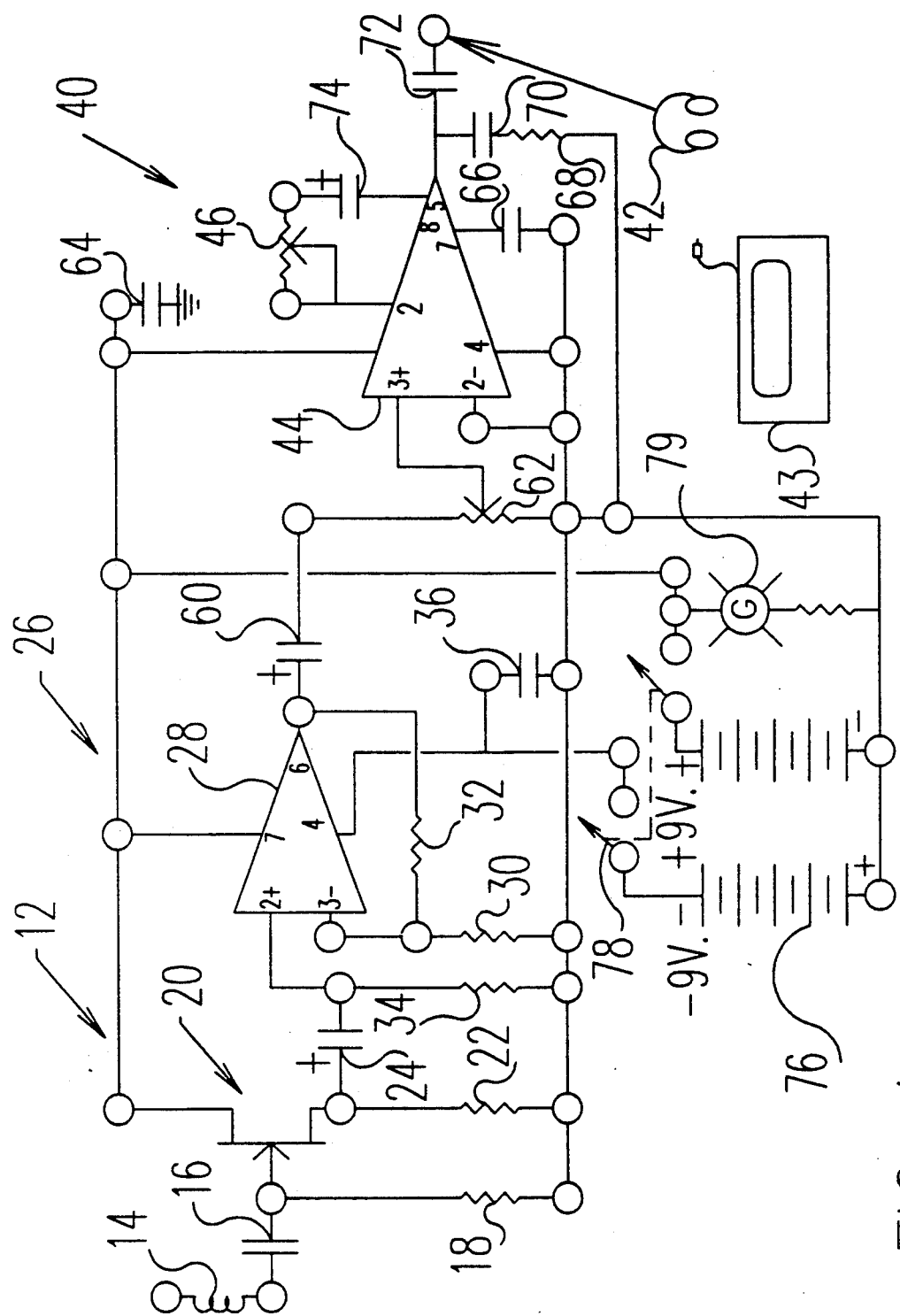
FIG. 1 is a schematic diagram of the electrostatic discharge (ESD) detector.

Referring to FIG. 1 of the invention, the input amplifier circuit 12 consists of a high gain, high impedance FET amplifier. The circuit is normally used as an electrometer input to measure electric field strength. Instead of an input probe, this circuit uses a coil of wire 14 that functions as an antenna. The input antenna 14 is designed to have six turns of 22-gauge insulated wire wound on a ½ inch diameter form, having 0.187 inches between windings. A 100 pf D.C. blocking capacitor 16 and a 1 megohm bleed resistor 18 protect the field effect transistor 20. The FET source resistor 22 is 1.2K ohms.

The output of the circuit 12 is coupled through a 1 µf capacitor 24 to the second stage amplifier 26, which uses a LF411 biFET operational amplifier (opamp) 28. The 1K resistor 30 and 20K resistor 32 set the gain of this stage at twenty. The bleed-off resistor 34 is 1 megohm, and the 0.01 µf capacitor 36 provides for noise suppression. This stage serves two functions: to boost the output of the input circuit 12 to interface with the power amplifier 40; and to act as a buffer between the two stages.

The power amplifier 40 produces the current gain to drive the monitoring means consisting of headphones 42, sound system or spectrum analyzer 43. It uses a LM386 power amp IC 44 which has adjustable feedback resistor at 46 so the gain can be internally matched to different output devices. The gain is adjustable between 20 (26 db) and 200 (46 db).

The second stage opamp 28 output is coupled through a second one µf coupling capacitor 60 to a volume adjust 50K resistor 62 at the input to power amplifier 40.

Power amplifier has 0.01 µf noise suppression capacitor 64 and 1.0 µf compensation capacitor 66. The 10 ohm resistor 68 and 0.1 µf capacitor 70 provide output stabilization. An output coupling capacitor 72 of 10 µf connects to headphones 42, a sound amplifier, or spectrum analyzer 43. The feedback capacitor 74 is 10 µf.

The power supply consists of two serially connected nine-volt batteries 76 controlled by double pole, double throw switch 78. An LED indicator 79 indicates power on. The FET amplifiers can be a Motorola 2N5459 low-frequency, low-noise JFET. The second stage amplifier can be a National Semiconductor LF411 operational amplifier and the power amplifier a National Semiconductor LM386.

Referring to FIGS. 2A, 2B, and 2C, the ESD event detector is generally indicated at 80 within a housing 82. The switch 78 controls the power, and power on is indicated at LED 79. The control knob 84 controls volume to headset 42. Antenna 14 can be seen through plexiglass window 86. The headset 42 or other monitoring device can be unplugged by plug 88. This hand-held device weighs less than 27 ounces (765 grams), and the dimensions are approximately 5×2×1". Directional sensitivity is afforded by antenna 14 sensing through plexiglass window 86.

While a preferred embodiment of the invention has been disclosed, various modes of carrying out the principles disclosed herein are contemplated as being within the scope of the following claims. Therefore, it is understood that the scope of the invention is not to be limited except as otherwise set forth in the claims.

What is claimed is:

1. A non-contact, electrostatic discharge event detector comprising:
   a. a high impedance antenna input circuit to pass through a single-event signal and suppress a repeated background signal, said input circuit further comprising:
      i. an antenna connecting to a blocking capacitor;
      ii. a high impedance FET having an input in series with the blocking capacitor; and
      iii. a first output coupling capacitor connecting to the FET;
   b. amplification means to amplify said single-event signal; and
   c. monitoring means to audit and record said single-event signal for detection and signature analysis.

2. The event detector as recited in claim 1 wherein the amplification means further comprises:
   a. a biFET operational amplifier;
   b. a second output coupling capacitor; and
   c. an adjustable resistor having input from the second coupling capacitor.

3. The event detector as recited in claim 2 wherein the output means further comprises:
   a. a power amplifier integrated circuit (IC);
   b. an adjustable feedback means;
   c. an output capacitor; and
   d. a monitoring means connected to the power amplifier.

4. The event detector as recited in claim 3 wherein the monitoring means consists of earphones.

5. The event detector as recited in claim 3 wherein the monitoring means consists of a spectrum analyzer.

6. A non-contact, electrostatic discharge (ESD) event detector comprising:
   a. an electrometer input circuit further comprising:
      i. an antenna connecting to a blocking capacitor;
      ii. a high-impedance FET having an input from the blocking capacitor; and
      iii. a first output coupling capacitor connecting to the FET;
   b. a second stage amplifier having an input from the first output coupling capacitor further comprising:
      i. a biFET operational amplifier;
      ii. a second output coupling capacitor; and
      iii. an adjustable resistor having input from the second coupling capacitor;
   c. a power amplifier having input from the adjustable resistor further comprising:
      i. a power amplifier integrated circuit (IC);
      ii an adjustable feedback means; and
      iii. an output capacitor;
   d. a power supply; and
   e. a monitoring means connected to the power amplifier wherein a local electrostatic discharge event is detected, amplified, and monitored by an operator.

7. The ESD event detector as recited in claim 6 wherein the monitoring means is a headphone.

8. The ESD event detector as recited in claim 6 wherein the monitoring means is a spectrum analyzer.

9. The ESD event detector as recited in claim 6 wherein the monitoring means is a sound amplifier system.

* * * * *